United States Patent
Guerrero Mercado

(12) 
(10) Patent No.: US 6,731,103 B1
(45) Date of Patent: May 4, 2004

(54) PEAK DETECTOR CIRCUIT

(75) Inventor: Francisco Javier Guerrero Mercado, Landsberg am Lech (DE)

(73) Assignee: National Semiconductor Corporation, Santa Clara, CA (US)

( * ) Notice: Subject to any disclaimer, the term of this patent is extended or adjusted under 35 U.S.C. 154(b) by 9 days.

(21) Appl. No.: 09/989,744

(22) Filed: Nov. 20, 2001

(51) Int. Cl.[7] .............................................. G01R 19/00
(52) U.S. Cl. .................................................. 324/103 P
(58) Field of Search ........................ 324/103 P, 103 R, 324/76.79, 76.81, 76.82; 327/72, 73, 87; 320/137, 157

(56) References Cited

U.S. PATENT DOCUMENTS

| | | | |
|---|---|---|---|
| 4,588,905 A | 5/1986 | Kojima ........................ 307/269 |
| 4,821,292 A | 4/1989 | Childress ...................... 375/76 |
| 5,015,878 A | 5/1991 | Lasagna et al. .............. 307/358 |
| 5,274,273 A | 12/1993 | Baginski et al. ............. 307/358 |
| 5,438,289 A | 8/1995 | Kan et al. ....................... 327/97 |
| 5,627,860 A | 5/1997 | McKinny et al. ............ 375/317 |
| 5,742,899 A | 4/1998 | Blackburn et al. ........ 455/234.2 |
| 5,804,997 A | 9/1998 | Nishizono et al. ........... 327/103 |
| 5,861,831 A | 1/1999 | Murden et al. .............. 341/139 |
| 5,920,589 A | 7/1999 | Rouquette et al. ........... 375/206 |
| 5,986,719 A | 11/1999 | Nakamura ................... 348/682 |
| 6,525,573 B1 | 2/2003 | Guerrero Mercado ....... 327/72 |
| 2001/0010460 A1 * | 8/2001 | Miller et al. ................... 324/67 |

OTHER PUBLICATIONS

"Introduction to Data Conversion and Processing", Data Conversion System Design by Behzad Ravavi, IEEE Press ISBN 0–7803–1093–4, pp. 1–5 (no dated).

Page 9 of NSC 'Application Note 4' from 1991 NSC Linear Applications Handbook.

* cited by examiner

*Primary Examiner*—N. Le
*Assistant Examiner*—Amy He
(74) *Attorney, Agent, or Firm*—Merchant & Gould PC; Timothy P. Sullivan

(57) ABSTRACT

The present invention implements a peak detector circuit without the use of a DSP (digital signal processor) or ADC. A reference signal is produced that relates to a DAC output code. The reference signal is used as a starting point, and is compared to the input signal. A feedback signal is produced that is used to adjust the reference signal thereby implementing a peak detector. The invention can implement these functions with a minimal complexity and a minimal die area.

24 Claims, 7 Drawing Sheets

PEAK DETECTOR CIRCUIT

FIELD OF THE INVENTION

The present invention is related to electronic circuits for signal processing, and more specifically to an ADC peak detector circuit.

BACKGROUND OF THE INVENTION

Generally, signal processing used for peak detection involves the use of a digital signal processor as well as other circuitry. Typically, the following method is used to perform peak detection. First, an analog signal is filtered with an anti-alias filter. The analog signal is then converted to a digital signal by means of an ADC (analog to digital converter). Next, a DSP (digital signal processor) is used perform the peak detection function on the digital signal. The digital signal is then converted back to an analog signal by means of a DAC (digital to analog converter). Finally, the signal is filtered with a low pass filter.

The peak detection signal system described above requires many complex components taking up resources on the circuit. For example, extra power is needed to provide power to the DSP (digital signal processor), ADC, and other components. Additionally, the available die area on the chip is reduced by each extra component placed on it. For example, the DSP takes up valuable resources on the circuit. Even simple signal processing functions may require many extra components taking up valuable resources.

SUMMARY OF THE INVENTION

The present invention is directed at peak detection without the use of a digital signal processor and ADC. The invention is also directed at implementing peak detection with minimal complexity and a minimal die area.

According to one aspect of the invention, no A/D converter circuitry is needed. Instead, a reference signal, which according to one embodiment of the invention relates to a DAC output signal, is used as a starting point and is adjusted to produce the desired peak detection signal processing function. Comparisons are made between the reference signal and an input signal. The reference signal is adjusted to obtain the peak detection function.

According to another aspect of the invention, an algorithm implements a signal processing function based on the history of the last n comparisons between the reference signal and the incoming signal, where n is a pre-determined number greater than zero. The algorithm may also generate feedback that modifies the reference signal.

According to another aspect of the invention, an apparatus for signal processing comprises a controlled reference circuit that produces a reference signal corresponding to a code. The apparatus also comprises a decision level processing circuit that is arranged to make a comparison between the reference signal and an input signal. The decision level processing circuit is configured to produce a desired signal processing function in response to the comparison.

According to another aspect of the invention, a method for performing peak detection for an incoming signal is provided. The method includes making a comparison between a reference code relating to a code and another signal, applying a peak detection signal processing function to the signal, and producing an output signal in response to the comparison and the peak detection signal processing function.

According to yet another aspect of the invention, an apparatus for a peak detection circuit comprises a means for signal processing without the use of a DSP and ADC. The apparatus produces a reference signal in response to a DAC signal and makes a comparison between the reference signal and an analog signal. A means for peak detection signal processing is applied and a signal relating to the peak of the signal is produced in response to the comparison and the signal processing function.

DETAILED DESCRIPTION OF THE PREFERRED EMBODIMENTS

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means a direct electrical connection between the items connected, or an indirect connection through one or more passive or active intermediary devices. The term "circuit" means either a single component or a multiplicity of components, either active and/or passive, that are coupled to provide a desired function. The term "signal" means at least one current, voltage, or data signal.

Briefly described, the present invention is directed at a circuit for peak detection without the use of a digital signal processor and ADC. A reference signal is used as a starting point and is adjusted to obtain the desired peak detection function. According to one embodiment of the invention, comparisons are made between a reference signal, relating to the output code of a DAC (digital to analog conversion) circuit, and the input signal thereby generating a comparison result signal. Logic is then applied to the comparison result signal to implement the peak detection signal processing function. The logic is also used to help generate a feedback signal that may modify the reference signal.

Figure 1:
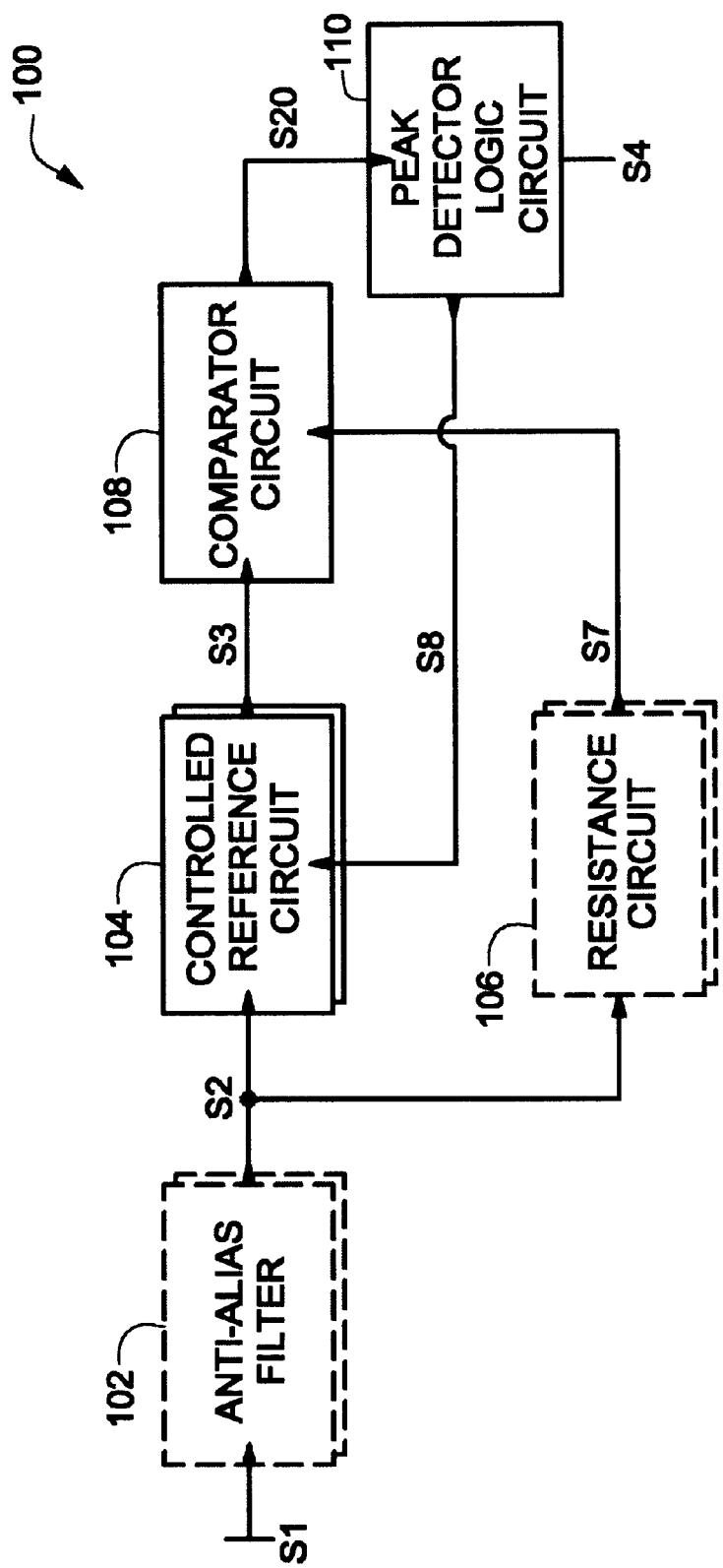
FIG. 1 shows an overview schematic block diagram of a peak detection circuit.

FIG. 1 is an overview schematic block diagram of a peak detector circuit, in accordance with aspects of the invention. As shown in the figure, peak detector circuit 100 includes anti-alias filter 102, controlled reference circuit 104, resistance circuit 106, comparator circuit 108, and peak detector logic circuit 110.

Peak detector circuit 100 is connected as follows. Anti-alias filter 102 includes an input coupled to signal S1, an output coupled that is coupled to an input of controlled reference circuit 104, and an output that is coupled to resistance circuit 106. Controlled reference circuit 104 has an input that is coupled to anti-alias filter 102, an input that is coupled to peak detection logic circuit 110, and an output that is coupled to comparator circuit 108. Resistance circuit 106 has an input that is coupled to anti-alias filter 102, and an output that is coupled to comparator circuit 108. Comparator circuit 108 has an input that is coupled to controlled reference circuit 104, an input that is coupled to resistance circuit 106, and an output that is coupled to peak detector logic circuit 110. Peak detector logic circuit has an input that is coupled to comparator circuit 108, an output that is coupled to controlled reference circuit 104, and another output coupled to signal S4.

Peak detector circuit 100 operates as follows. Input signal S1 is filtered by anti-alias filter 102 producing signal S2. Controlled reference circuit 104 produces reference signal S3 that relates to signal S2. According to one embodiment of the invention, controlled reference circuit 104 is a DAC. According to an embodiment, controlled reference circuit 104 produces a reference voltage signal that corresponds to a given input signal (S2). Signal S3 is adjusted in response signal S8 output by peak detector logic circuit 10. By directly adjusting the controlled reference circuit output reference signal S3, a peak detection signal processing function may be applied to input signal S1 without the use of a DSP and ADC.

Resistance circuit 106 produces signal S7 in response to incoming signal S2. Signal S7 directly relates to input signal S2. Comparator circuit 108 compares signal S3, output from controlled reference circuit 104, and signal S7, output by resistance circuit 106. Comparator circuit 108 determines when the reference signal is larger/smaller than the input signal. In response to the comparison between signal S3 output from controlled reference circuit 104, and the input signal S7, comparator circuit 108 produces signal S20 that relates to the comparison. Peak detector logic circuit 110 produces feedback signal S8 that is used to adjust signal S3 produced by controlled reference circuit 104. Peak detector logic circuit 110 contains the logic necessary to provide feedback signal S8 used to adjust signal S3 output by controlled reference circuit 104 to perform the peak detection function on the incoming signal. Peak detector logic circuit 110 may also contain counters and other components to produce the desired peak detection function. Signal S3 is adjusted upward when the input signal moves up and signal S3 is adjusted downward when the input signal moves down.

Peak detector circuit 100 has several advantages. The architecture has a very low cost of manufacture, and utilizes a small die area. Additionally, the peak detector circuit does not require the use of a digital signal processor to perform the peak detection functions.

Figure 2:
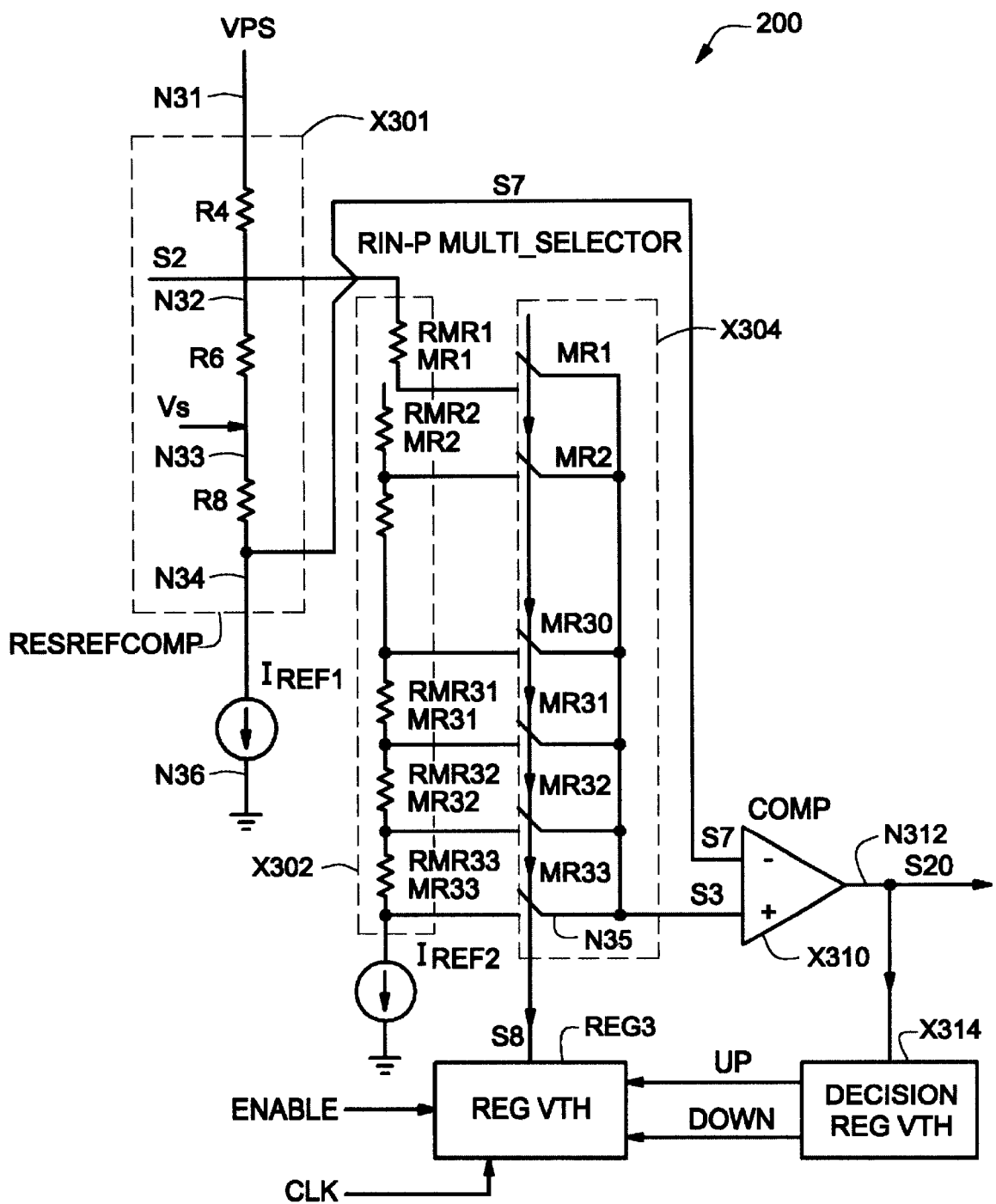
FIG. 2 illustrates a schematic block diagram of an exemplary peak detection circuit.

FIG. 2 is a schematic diagram of a peak detector circuit, in accordance with aspects of the invention. As shown in the figure, peak detector circuit 200 includes, resistor array X301 (resistor R4, resistor R6, and resistor R8), current source IRef1, current source IRef2, resistor array X302, multiplexer X304, comparator X310, register Reg3, and decision circuit X314. Multiplexer X304 includes switches MR1 through MR33. Resistor array X302 includes resistors RMR1 through RMR33.

Peak detector circuit 200 is connected as follows. Resistor R4 is coupled between node N31 and node N32. Resistor R6 is coupled between node N32 and node N33. Resistor R8 is coupled between node N33 and node N34. Current source IRef1 is coupled between node N34 and node N36. Node N36 is coupled to a reference voltage (gnd). Resistor RMR1 is coupled between node N32 and node NMR1. Switch MR1 is coupled between node NMR1 and node N35, and has a switch control coupled to an input to register reg3. Resistor RMR2 is coupled between node NMR1 and node NMR2. Switch MR2 is coupled between node NMR2 and node N35, and has a switch control coupled to the input to register reg3. Resistor MR3 is coupled between node NRM2 and node NMR3. Switch MR3 is coupled between node NMR3 and node N35, and has a switch control coupled to the input to register reg3. These connections continue until resistor RMR33 is coupled between NMR32 and node NMR33, and switch MR33 is coupled between node NMR33 and node N35, and has a switch control coupled to the input to register reg3. Current source IRef2 is coupled between node NMR33 and a reference voltage (gnd). Comparator X310 has a non-inverting input (+) coupled to node N35, an inverting input (−) coupled to node N34, and an output coupled to node N312. Peak detection decision circuit X314 has an input coupled to node N312, an output coupled to register Reg3, and another output coupled to register Reg3.

Peak detector circuit 200 operates as follows. Peak detector circuit 200 is directed at peak detection for voltage VPS (See FIGS. 4A and 4B and related discussion).

The specific operation of peak detector circuit 200 will now be described. Resistor array X302, current source IRef2, and multiplexer X304 act together as a controlled reference circuit (in this particular case a DAC), producing reference signal S3 in response to incoming signal S2. Resistor array X301 provides a VPS voltage representation signal (S7). Resistor array X302 provides a reference voltage relating to the input signal S2. The switches (MR1–MR33) actuate in response to signal S8. Signal S8 has a corresponding VPS voltage (VS8rep). In response to the switches actuating, the signal S3 at node N35 increases or decreases. According to one embodiment of the invention, current source Iref1 is created by a shunt circuit that sets the voltage at node N33 to a known voltage. Other reference voltages may be implemented and used.

Comparator X310 compares signal S3 to signal S7 producing comparison result signal S20 at node N312. Signal S20 has a voltage corresponding to a logical level of "low" when the voltage of signal S7 is greater than the voltage of signal S3. Correspondingly, signal S20 has a voltage corresponding to a logical level of "high" when the voltage of signal S7 is less than the voltage of signal S3. Signal S8 is produced by register Reg3 in response to comparison result signal S20, signal S3, clock signal CLK, and control signal ENABLE. Decision circuit X314 receives comparison result signal S20 and determines when signal S3 should increase and when it should decrease, and the result is stored in register reg3. According to one embodiment of the invention, signal S3 increases when the voltage of S3 is lower than the voltage of S7 and, correspondingly, signal S3 decreases when the voltage of S3 is higher than the voltage of signal S7.

According to one embodiment of the invention, peak detector circuit 200 is used in a battery charging circuit.

Figure 3A:
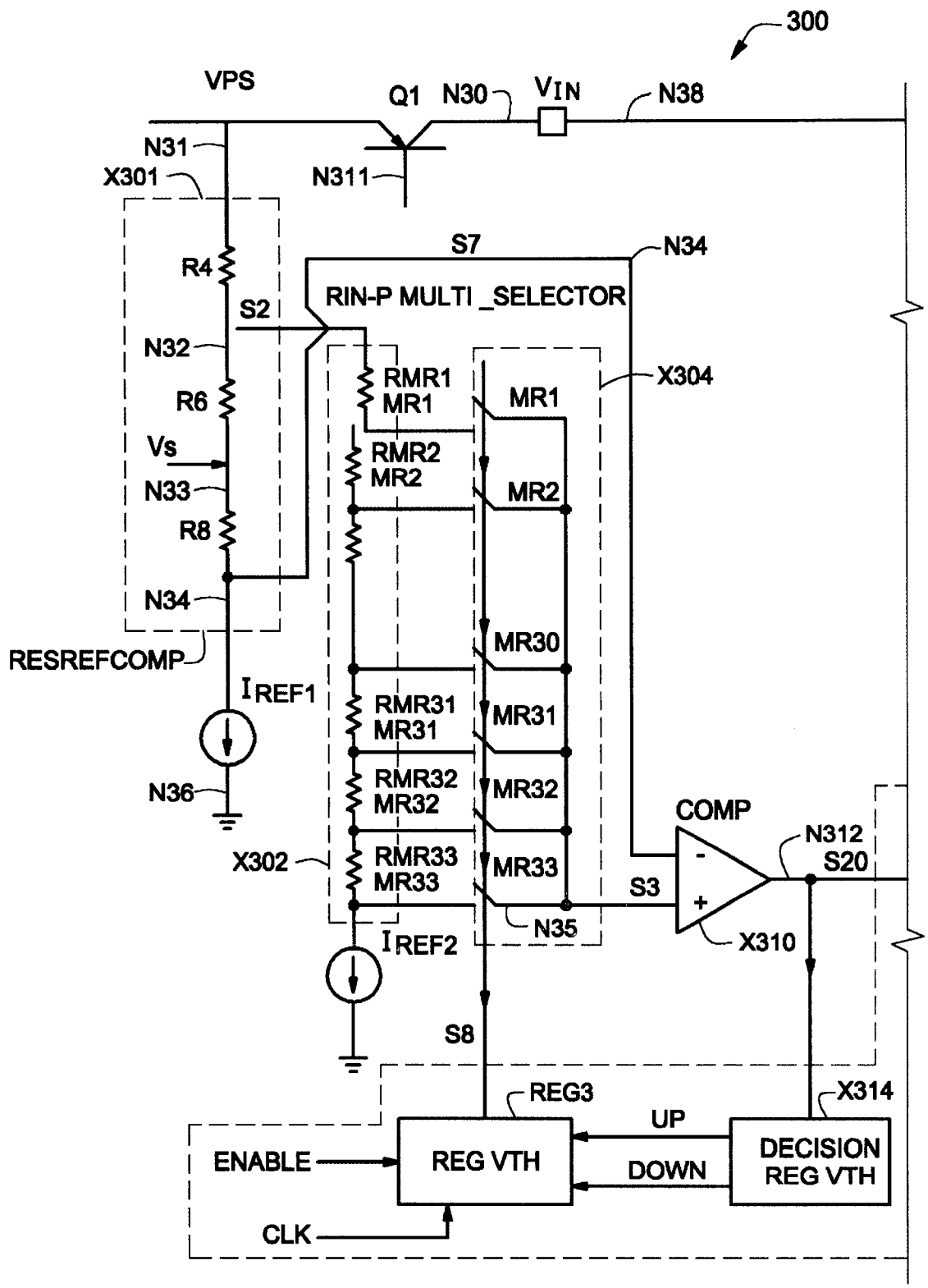
FIG. 3 shows a schematic block diagram of the peak detection circuit utilized within a battery charging circuit.
Figure 3B:
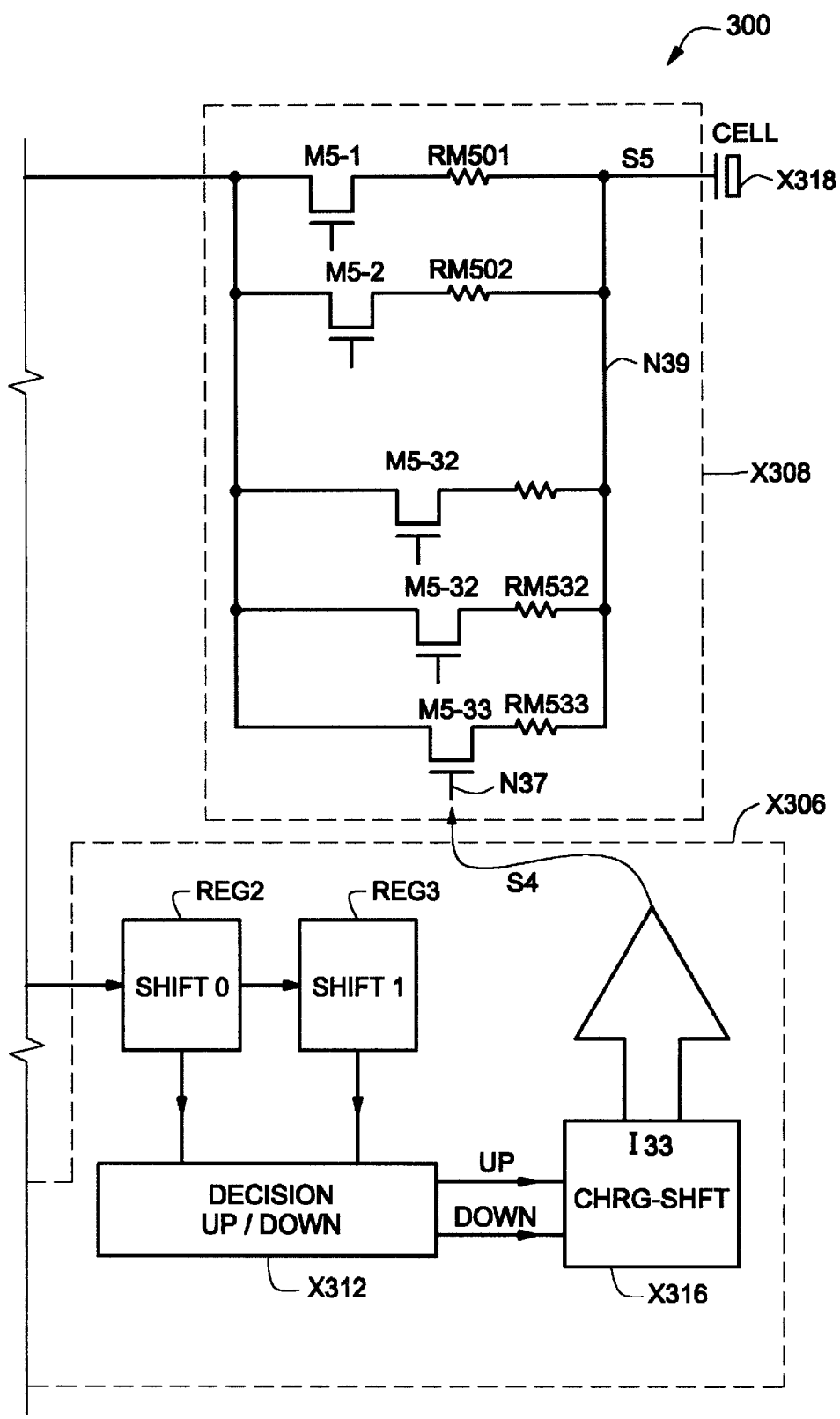

FIG. 3 is a schematic block diagram of the peak detector circuit illustrated in FIG. 2 incorporated into a battery charging circuit, in accordance with aspects of the invention. As shown in the figure, battery charging circuit 300 includes the following additional components as shown in FIG. 2. The components include transistor Q1, decision logic circuit X306, transistor array X308, cell X318, and input VIN. Transistor array X308 includes transistors M5-1 through M5-33 and resistors RM501 through RM533. Decision logic circuit X306 includes register Reg1, register Reg2, register Reg3, decision up/down circuit X312, decision circuit X314, and charger shifting circuit X316.

Battery charging circuit 300 is connected as follows. Transistor Q1 has a collector coupled to node N30, an emitter coupled to node N31, and a base coupled to node N311. Input VIN is coupled between node N30 and node N38. Resistor R4 is coupled between node N31 and node N32. Resistor R6 is coupled between node N32 and node N33. Resistor R8 is coupled between node N33 and node N34. Current source IRef1 is coupled between node N34 and node N36. Node N36 is coupled to a reference voltage (gnd). Resistor RMR1 is coupled between node N32 and node NMR1. Switch MR1 is coupled between node NMR1 and node N35, and has a switch control coupled to an input to register reg3. Resistor RMR2 is coupled between node NMR1 and node NMR2. Switch MR2 is coupled between node NMR2 and node N35, and has a switch control coupled to the input to register reg3. Resistor MR3 is coupled between node NRM2 and node NMR3. Switch MR3 is coupled between node NMR3 and node N35, and has a switch control coupled to the input to register reg3. These connections continue until resistor RMR33 is coupled between NMR32 and node NMR33, and switch MR33 is coupled between node NMR33 and node N35, and has a switch control coupled to the input to register reg3. Current source IRef2 is coupled between node NMR33 and a reference voltage (gnd). Comparator X310 has a non-inverting input (+) coupled to node N35, an inverting input (−) coupled to node N34, and an output coupled to node N312. Decision circuit X314 has an input coupled to node N312, an output coupled to register Reg3, and another output coupled to register Reg3. Register Reg2 has an input coupled to node N312, an output coupled to register Reg1, and another output coupled to decision up/down circuit X312. Register Reg1 has an input coupled to register Reg2, and an output coupled to decision up/down circuit X312. Decision up/down circuit X312 has an input coupled to register Reg1, an input coupled to register Reg2, an output coupled to a first input of charger-shifting logic circuit X316, and an output coupled a second input of charge-shifting circuit X316. Charger shifting circuit X316 has two inputs coupled to decision up/down circuit X312, and a logic output coupled transistor array X308. Each of the transistors M5-1 through M5-33 has a gate coupled to charge shifting circuit X316, a source coupled to node N38, and a drain coupled to its respective resistor RM501 through RM533. Each resistor RM501 through RM533 is coupled between the source of its respective transistor M5-1 through M5-33 and node N39. Cell X318 is coupled to node N39.

Figure 4A:
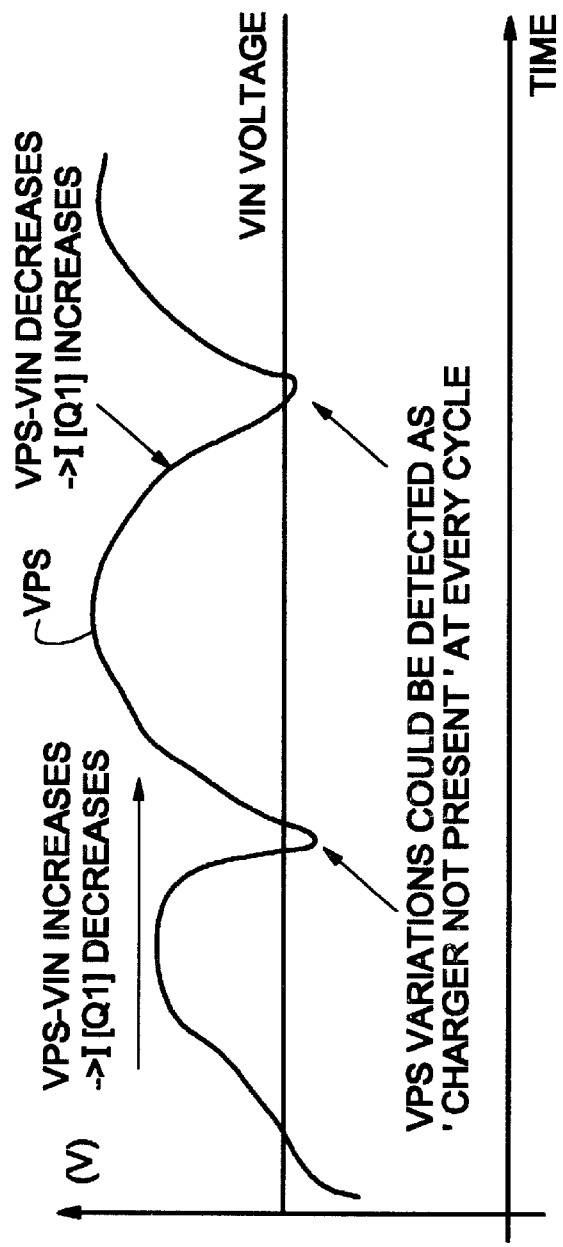
FIG. 4A illustrates an exemplary graph of VPS over time without a peak detector function.
Figure 4B:
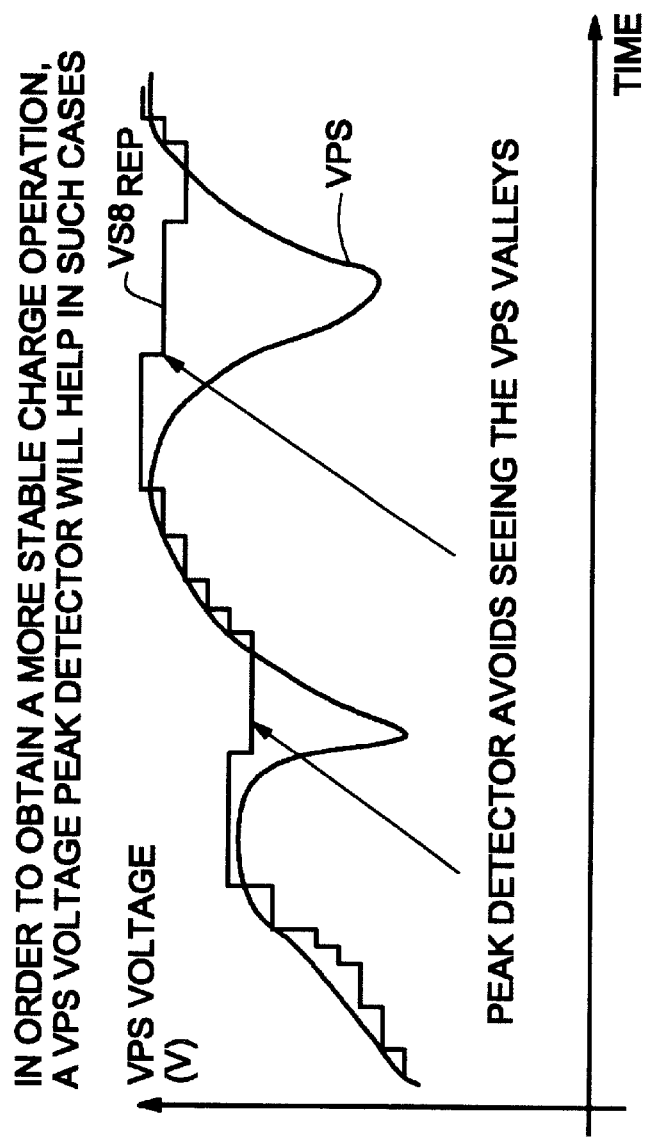
FIG. 4B illustrates an exemplary graph of a peak detector function applied to VPS over time.

Battery charging circuit 300 is directed at detecting peaks in voltage VPS (See FIGS. 4A and 4B and related discussion). More specifically, peak detection circuit 300 is configured to respond with a fast attack rate and a slow decay rate. In other words, battery charging circuit 300 responds quickly to increases in voltage and slowly to decreases in voltage.

The operation of the additional components illustrated in FIG. 3 will now be described. Samples of comparison result signal S20 are stored in registers Reg1 and Reg2. A first result from comparison result signal S20 is stored in register Reg1, and a second result from comparison signal S20 is stored in register Reg2. According to one embodiment of the invention, only one register is used. According to this particular embodiment, the input is sampled directly by the decision logic. Decision up/down circuit X312 utilizes an attack counter and delay counter to aid in determining when signal S4 should increase, decrease, or remain the same. Using an algorithm based upon the two comparator results stored in Reg1 and Reg2, the logic in decision up/down circuit X312 determines when the decay counter should be increased, decreased, or reset, and determines when the attack counter should be increased, decreased, or reset. Incrementing and decrementing the attack counter and decay counter affects how quickly the peak detector reacts to changes in VPS. Generally, decision logic circuit X312 implements a fast attack and slow decay. Using the fast attack allows the peak detector to quickly react to the peaks of VPS. Using the slow decay allows the peak detector to slowly react to a diminishing VPS (See FIG. 4B for an exemplary graph). Based on the values of the attack counter and decay counter, decision circuit X312 makes a determination as to whether signal S4 should increase, decrease, or remain the same.

Charger shifting circuit X316 includes drivers that produce a signal S4 to control transistor array X308. Transistor array X308 acts as a DAC (digital/analog converter). Charger shifting circuit X316 adjusts signal S4 according to the input that it receives from decision logic circuit X312. Signal S4 is converted into signal S5 by transistor array X308 and is propagates to cell X318.

The addition of peak detection circuit 200 to a battery charging circuit allows a smoother operation of the battery charger with a low cost and a small die area. The use of the peak detector avoids seeing the temporary VPS variations that could be detected as a "charger not present" signal thereby affecting the charging of cell X318.

FIG. 4A illustrates an exemplary graph of VPS and VIN over time. As shown in figure, the graph shows voltage VPS periodically dropping below the VIN voltage. Each time VPS drops below VIN, a "charger not present" signal could be detected by the battery charging circuit thereby adversely affecting the charging of the battery.

FIG. 4B illustrates an exemplary graph of a peak detector signal processing function applied to VPS over time, in accordance with aspects of the invention. As shown in the figure, the graph illustrates voltage VPS and signal VS8rep over time. Signal VS8rep is the corresponding VPS voltage defined for a given S8 code. As can be seen, signal VS8rep does not drop below the VIN voltage thereby avoiding any "charger not present" signals. According to one embodiment of the invention, when VPS increases for two consecutive clock cycles, signal VS8rep increases. The peak detector signal illustrated in FIG. 4B is produced by the peak detector circuit illustrated in FIG. 3. The peak detector used in the battery charging circuit has a fast attack and a slow decay. In other words, signal VS8rep increases rapidly in response to increases in voltage VPS and signal VS8rep decreases slowly in response to decreases in voltage VPS. According to one embodiment, signal VS8rep decreases when voltage VPS decreases for 255 consecutive clock cycles. This results in a slow decay, so that signal VS8rep decreases slowly when voltage VPS decreases. The slow decay prevents erratic behavior of the overall circuit. If decay were too fast, valleys in the VPS voltage might be detected as "charger not present," as shown in FIG. 4A. The attack counter and decay counter may be adjusted to change the characteristics of signal VS8rep.

Figure 5:
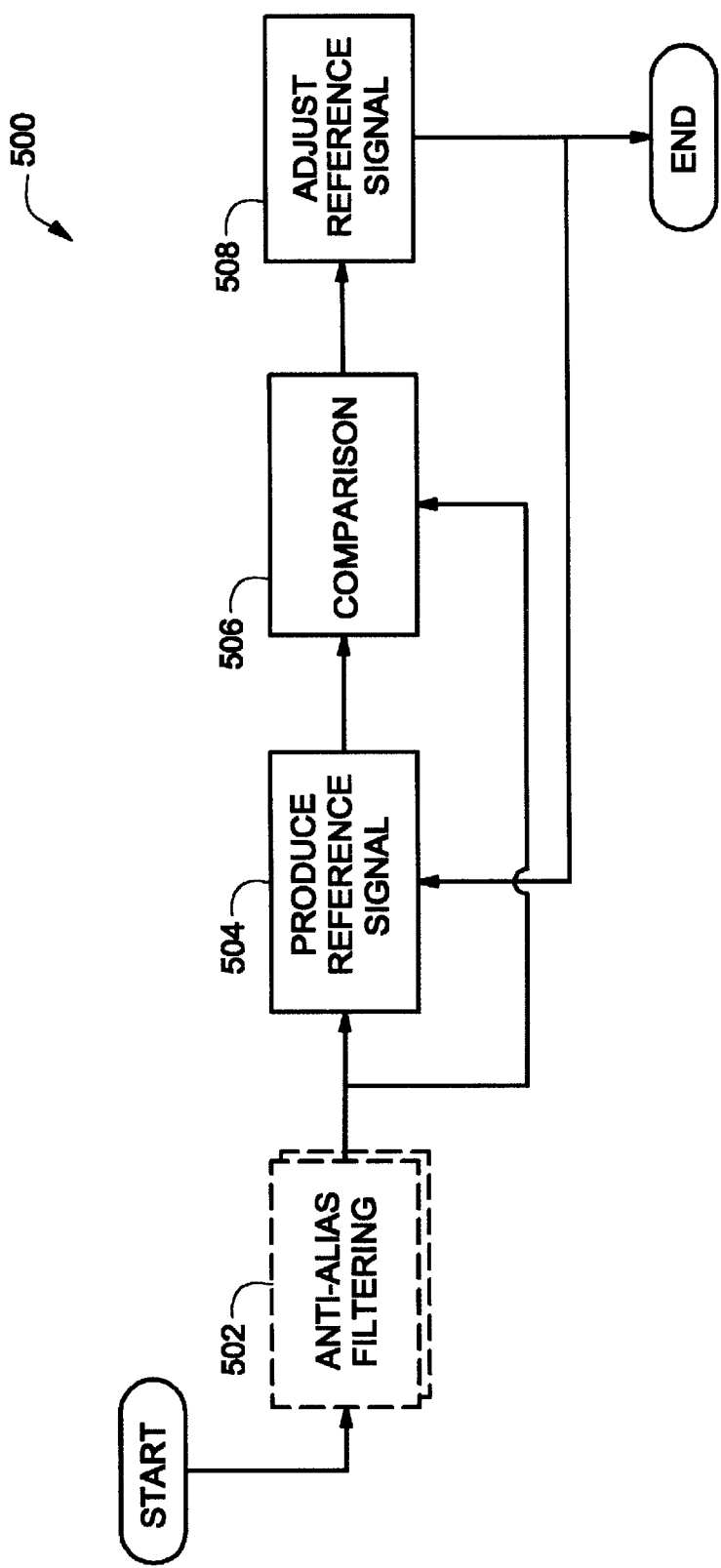
FIG. 5 shows a flow chart for a peak detection signal processing circuit, in accordance with aspects of the invention.

FIG. 5 shows a flow chart for an exemplary peak detection signal processing circuit, according to one embodiment of the invention. The method for signal processing architecture 500 includes blocks 502, 504, 506, and 508.

The flow for signal processing architecture 500 proceeds as follows. After a start block, the logic moves to block 502. At block 502, a signal is filtered with an anti-alias filter producing a filtered signal. The logic then moves to block 504, at which point the filtered signal is converted into a reference signal. According to one embodiment of the invention, the reference signal relates to a DAC output code. The reference signal itself is adjusted to obtain the desired peak detection signal processing function. The reference signal may be adjusted for feedback generated in response to the peak detection algorithm implemented at block 508. Stepping to block 506, a comparison is made between the incoming signal and the reference signal. Moving to block 508, the reference signal may be adjusted to perform a peak detection function on the incoming signal. The logic then steps to an end block and terminates.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus for a peak detector, comprising:
   a controlled reference circuit that includes an input connected to an input signal (S2) and an input connected to a feedback signal (S8) that is configured to produce a reference signal (S3) in response to the input signal (S2) and the feedback signal (S8);
   a comparator circuit that is arranged to produce a comparison result signal at relates to the input signal, and the reference signal (S3); and
   a peak detector logic circuit that includes an input coupled to the comparison result signal, an output configured to produce the feedback signal (S8) in response to the comparison result signal, wherein the feedback signal is used to adjust the reference signal (S3).

2. The apparatus as in claim 1, wherein the comparator circuit includes a first input arranged to receive a signal (S7) that relates to the input signal and a second input arranged to receive the reference signal, and an output arranged to produce the comparison result signal in response to a comparison between the signal (S7) and the reference signal.

3. The apparatus as in claim 2, wherein the peak detector logic circuit further comprises a decision circuit that includes an input coupled to the comparison result signal; and an output coupled to a register circuit, wherein the register circuit includes an output that is arranged to produce the feedback signal.

4. The apparatus as in claim 3, further comprising a first current source coupled to a first resistor array, wherein the first resistor array is configured to generate the signal (S7) in response to the input signal.

5. The apparatus as in claim 4, wherein the first current source is created by a shunt circuit.

6. The apparatus as in claim 4, wherein the controlled reference circuit, is configured as a DAC.

7. The apparatus as in claim 4, wherein the controlled reference circuit, further comprises a second resistor array coupled to a second current source, wherein the second resistor array relates to a reference voltage.

8. The apparatus as in claim 7, wherein the controlled reference circuit further comprises a multiplexer circuit.

9. The apparatus as in claim 8, wherein the multiplexer circuit, includes a predetermined number of switches that are arranged to actuate, wherein the reference signal relates to the predetermined number of switches that are actuating.

10. The apparatus as in claim 9, wherein the comparator circuit produces the comparison result signal having a logical level of "high" when the signal (S7) is greater than the reference signal and produces the comparison result signal having a logical level of "low" when the signal (S7) is less than the reference voltage.

11. The apparatus as in claim 10, wherein the register circuit further comprises, a clock input arranged to receive a clock signal; and an enable input arranged to receive an enable signal, wherein the feedback signal relates to the clock signal received at the clock input and the enable signal received at the enable input.

12. The apparatus as in claim 11, wherein the decision circuit determines when the reference signal should increase and when the reference signal should decrease; wherein a decision that relates to the determination is stored in the register circuit.

13. A method for a peak detection function, comprising:
    producing a reference signal directly from a feedback signal and an input signal;
    making a comparison between an input signal and the reference signal and generating a comparison signal;
    producing the feedback signal directly from the comparison signal; and
    adjusting the reference signal in response to the comparison to produce the peak detection function.

14. The method as in claim 13, wherein adjusting the reference signal in response to the comparison, further comprises adjusting the reference signal in response to a feedback signal, wherein the feedback signal relates to the comparison.

15. An apparatus for signal processing comprising:
    a means for producing a reference signal directly from a feedback signal and an input signal;
    a means for making a comparison between the input signal and the reference signal and generating a comparison signal;
    a means for producing the feedback signal directly utilizing the comparison signal; and
    a means for adjusting the reference signal in response to the comparison to implement a peak detection function.

16. An apparatus for a peak detector, comprising:
    a controlled reference circuit that is configured to produce a reference signal (S3) in response to an input signal (S2) and a feedback signal (S8);
    a comparator circuit that is arranged to produce a comparison result signal that relates to the input signal, and the reference signal (S3), wherein the comparator circuit includes a first input arranged to receive a signal (S7) that relates to the input signal and a second input arranged to receive the reference signal, and an output arranged to produce the comparison result signal in response to a comparison between the signal (S7) and the reference signal;
    a first current source coupled to a first resistor array, wherein the first resistor array is configured to generate the signal (S7) in response to the input signal; and
    a peak detector logic circuit that includes an input coupled to the comparison result signal, an output configured to produce the feedback signal (S8) in response to the comparison result signal, wherein the feedback signal is used to adjust the reference signal (S3); wherein the peak detector logic circuit further comprises a decision circuit that includes an input coupled to the comparison result signal; and an output coupled to a register circuit, wherein the register circuit includes an output that is arranged to produce the feedback signal.

17. The apparatus as in claim 16, wherein the first current source is created by a shunt circuit.

18. The apparatus as in claim 16, wherein the controlled reference circuit, is configured as a DAC.

19. The apparatus as in claim 16, wherein the controlled reference circuit, further comprises a second resistor array coupled to a second current source, wherein the second resistor array relates to the reference voltage.

20. The apparatus as in claim 19, wherein the controlled reference circuit further comprises a multiplexer circuit.

21. The apparatus as in claim 20, wherein the multiplexer circuit, includes a predetermined number of switches that are arranged to actuate, wherein the reference signal relates to the to the predetermined number of switches that are actuating.

22. The apparatus as in claim 21, wherein the comparator circuit produces the comparison result signal having a logical level of "high" when the signal (S7) is greater than the reference signal and produces the comparison result signal having a logical level of "low" when the signal S7 is less than the reference voltage.

23. The apparatus as in claim 22, wherein the register circuit further comprises, a clock input arranged to receive a clock signal; and an enable input arranged to receive an enable signal, wherein the feedback signal relates to the clock signal received at the clock input and the enable signal received at the enable input.

24. The apparatus as in claim 23, wherein the decision circuit determines when the reference signal should increase and when the reference signal should decrease; wherein a decision that relates to the determination is stored in the register circuit.

* * * * *

UNITED STATES PATENT AND TRADEMARK OFFICE
CERTIFICATE OF CORRECTION

PATENT NO. : 6,731,103 B1
DATED : May 4, 2004
INVENTOR(S) : Francisco Javier Guerrero Mercado It is certified that error appears in the above-identified patent and that said Letters Patent is hereby corrected as shown below:

Column 3,
Line 32, "circuit 10" should read -- circuit 110 --.

Column 7,
Line 37, "signal at relates" should read -- signal that relates --.

Column 9,
Line 20, "relates to the to the predetermined" should read -- relates to the predetermined --.

Signed and Sealed this

Thirty-first Day of August, 2004

JON W. DUDAS
*Director of the United States Patent and Trademark Office*